(12) United States Patent
Chang

(10) Patent No.: US 8,742,659 B2
(45) Date of Patent: Jun. 3, 2014

(54) DISPLAY PIXEL AND DISPLAY DEVICE INCLUDING THE SAME

(75) Inventor: Yih Chang, New Taipei (TW)

(73) Assignee: Arolltech Co., Ltd., New Taipei (TW)

( * ) Notice: Subject to any disclaimer, the term of this patent is extended or adjusted under 35 U.S.C. 154(b) by 0 days.

(21) Appl. No.: 13/293,644

(22) Filed: Nov. 10, 2011

(65) Prior Publication Data

US 2012/0119642 A1 May 17, 2012

(30) Foreign Application Priority Data

Nov. 11, 2010 (TW) ................................ 99138776 A

(51) Int. Cl.
*H01J 1/62* (2006.01)
*H01J 63/04* (2006.01)

(52) U.S. Cl.
USPC ........... 313/504; 313/498; 313/499; 313/500; 313/506

(58) Field of Classification Search
USPC .................. 313/504, 506, 511, 512, 498–500
See application file for complete search history.

(56) References Cited

U.S. PATENT DOCUMENTS

| | | | | |
|---|---|---|---|---|
| 5,585,695 A | * | 12/1996 | Kitai | 313/506 |
| 5,644,327 A | * | 7/1997 | Onyskevych et al. | 345/80 |
| 5,814,935 A | * | 9/1998 | Ujihara | 313/504 |
| 5,818,404 A | * | 10/1998 | Lebby et al. | 345/82 |
| 6,201,346 B1 | * | 3/2001 | Kusaka | 313/504 |
| 6,356,032 B1 | * | 3/2002 | Suzuki et al. | 315/169.3 |
| 6,777,870 B2 | * | 8/2004 | Sundahl | 313/504 |
| 6,882,102 B2 | * | 4/2005 | Yamazaki | 313/504 |
| 6,894,432 B2 | * | 5/2005 | Fujieda et al. | 313/506 |
| 7,394,194 B2 | * | 7/2008 | Cok | 313/506 |
| 7,449,833 B2 | * | 11/2008 | Kobayashi | 313/506 |
| 8,319,419 B2 | * | 11/2012 | Kodama et al. | 313/503 |
| 2002/0153829 A1 | * | 10/2002 | Asai et al. | 313/496 |
| 2003/0001488 A1 | * | 1/2003 | Sundahl | 313/483 |
| 2006/0108913 A1 | * | 5/2006 | Cok | 313/500 |
| 2010/0314616 A1 | * | 12/2010 | Kodama et al. | 257/40 |

* cited by examiner

*Primary Examiner* — Thomas A Hollweg

(74) *Attorney, Agent, or Firm* — Ladas & Parry LLP

(57) ABSTRACT

A display pixel includes: a first stack including a transparent anode layer having first and second anode elements, a cathode layer, and a functional layer disposed between the anode layer and the cathode layer; a second stack disposed on the first stack and including an insulating layer and a conductive column line disposed on a surface of the insulating layer; a conductive bridging line disposed in the first stack and connected to the first and second anode elements; and an upper via unit including an upper contact via extending from the conductive column line into the first stack and connected to the bridging line or one of the first and second anode elements.

17 Claims, 14 Drawing Sheets

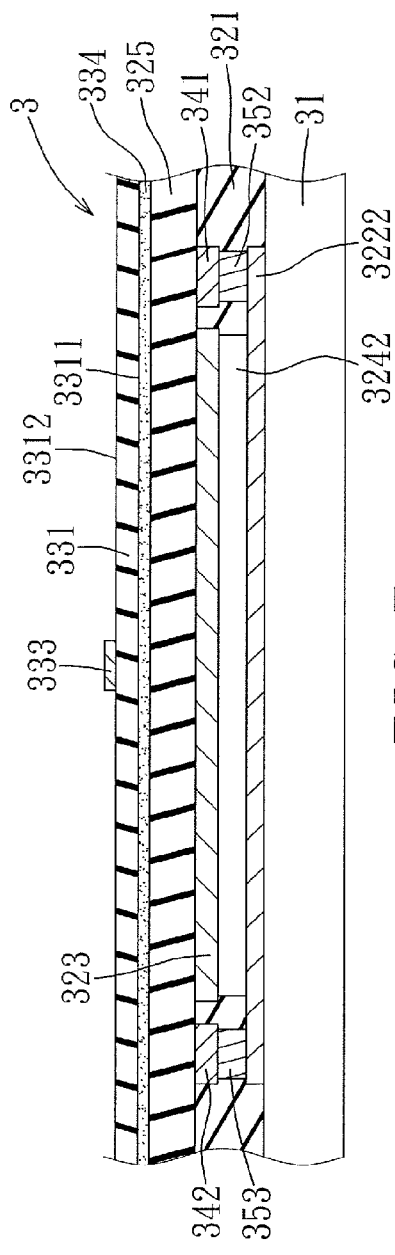
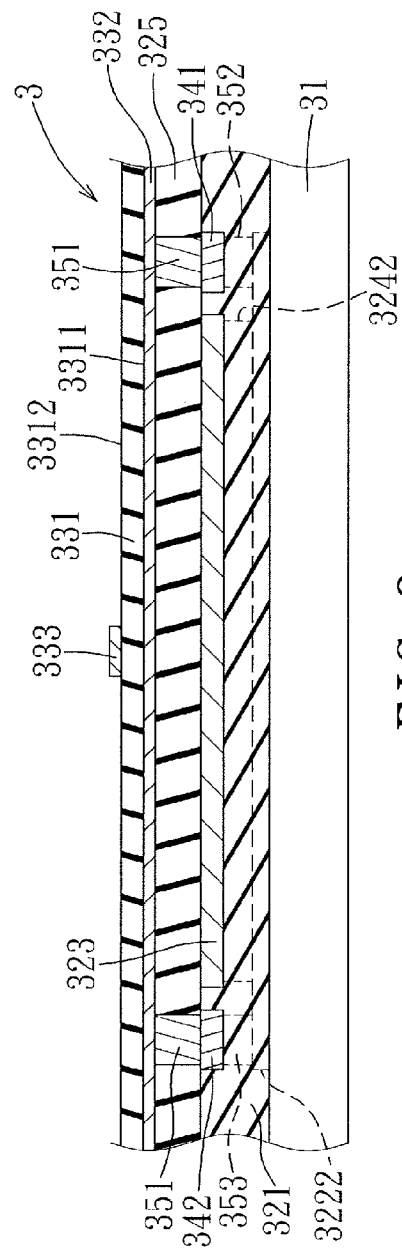

DISPLAY PIXEL AND DISPLAY DEVICE INCLUDING THE SAME

CROSS-REFERENCE TO RELATED APPLICATIONS

This application claims priority of Taiwanese Patent Application No. 099138776, filed on Nov. 11, 2010.

BACKGROUND OF THE INVENTION

1. Field of the Invention

This invention relates to a display pixel and a display device including the same, more particularly to a display pixel having two separate anode elements connected through a conductive bridging line.

2. Description of the Related Art

FIGS. 1 and 2 illustrate a display tile 2 of a conventional tiled display device disclosed in U.S. Pat. No. 6,897,855. The display tile 2 includes front and back layered structures 21, 22 disposed one above the other. The back layered structure 21 includes a circuit board 211 and a plurality of optional layers 212. The circuit board 211 has a bottom surface provided with a power connector 2112, an electronic circuitry 2113 connected to the power connector 2112 and a plurality of first and second conductors 2114, 2115 connected to the electronic circuitry 2113. The front layered structure 22 includes a transparent glass substrate 221, a filter 222 formed on the glass substrate 221, parallel column electrodes 223 formed on the filter 222, a displaying material layer 224 formed on the column electrodes 223, parallel row electrodes 225 formed on the displaying material layer 224. A plurality of first vias 23 are connected to the first conductors 2114 and extend through a first edge of the circuit board 211 and first edges of the optional layers 212 into the front layered structure 22 to connect with the column electrodes 223, respectively. A plurality of second vias 24 are connected to the second conductors 2115 and extend through a second edge of the circuit board 211 and second edges of the optional layers 212 into the front layered structure 22 to connect with the row electrodes 225, respectively. The column electrodes 223 are made from a transparent material of indium tin oxide (ITO) so as to permit light emitted or reflected by the displaying material layer 224 to pass through the column electrodes 223 and the glass substrate 221.

The aforesaid display tile 2 is disadvantageous in that the arrangement of the column electrodes 223 and the first and second vias 23, 24 is only suitable for a small size and rigid substrate (the glass substrate 221), and is likely to incur displaying problems, such as poor displaying quality and dead spots (incapable of displaying), when using a large size and flexible substrate instead of the glass substrate 221.

SUMMARY OF THE INVENTION

Therefore, an object of the present invention is to provide a display device that can overcome the aforesaid drawbacks associated with the prior art.

According to one aspect of this invention, there is provided a display pixel that comprises: a first stack including a transparent anode layer having separate first and second anode elements, a cathode layer, and at least one functional layer disposed between the anode layer and the cathode layer and having first and second functional elements disposed on the first and second anode elements, respectively; a second stack disposed on the first stack and including an insulating layer having a surface, and a conductive column line disposed on the surface of the insulating layer; a conductive bridging line disposed in the first stack and connected to the first and second anode elements; and an upper via unit including an upper contact via extending from the conductive column line into the first stack and connected to the bridging line or one of the first and second anode elements.

According to another aspect of this invention, there is provided a color pixel module that comprises: a first stack including a transparent anode layer, a cathode layer, and at least one functional layer disposed between the anode layer and the cathode layer, the anode layer having a plurality of first anode elements and a plurality of second anode elements, the functional layer having a plurality of first functional elements formed respectively on the first anode elements and capable of displaying different colors, respectively, and a plurality of second functional elements formed respectively on the second anode elements and capable of displaying the same colors as the first functional elements, respectively; a second stack disposed on the first stack and including an insulating layer having a surface, and a plurality of conductive column lines disposed on the surface of the insulating layer; a plurality of conductive bridging lines, each of which is disposed in the first stack and is connected to a respective one of the first anode elements and a respective one of the second anode elements; and a plurality of upper via units, each of which includes an upper contact via extending from a respective one of the conductive column lines into the first stack and connected to a corresponding one of the bridging lines or a corresponding one of the first and second anode elements.

According to yet another aspect of this invention, there is provided a display device that comprises: a first stack including a patterned transparent anode layer, a patterned cathode layer, and a patterned functional layer disposed between the anode layer and the cathode layer, the anode layer including an anode array of anode units arranged in columns, the cathode layer including a plurality of cathode units, the functional layer including a display array of functional units arranged in columns and formed on the anode units of the anode array, respectively; a second stack disposed on the first stack and including an insulating layer having opposite first and second surfaces, a plurality of conductive column lines disposed on the first surface of the insulating layer, and a plurality of conductive row lines disposed on the second surface of the insulating layer; an upper via array of upper via units arranged in columns, the upper via units of each of the columns of the upper via array extending from a respective one of the conductive column lines into the first stack and connected to the anode units of a respective one of the columns of the anode array, respectively; and a cathode via array of cathode contact vias arranged in rows. The cathode contact vias of each of the rows of the cathode via array extend from a respective one of the conductive row lines into the first stack and are connected to a corresponding one of the cathode units.

BRIEF DESCRIPTION OF THE DRAWING

Other features and advantages of the present invention will become apparent in the following detailed description of the preferred embodiments of this invention, with reference to the accompanying drawings, in which:

FIG. 7 is a sectional view of the first preferred embodiment taken along line VII-VII of FIG. 3;

FIG. 8 is a sectional view of the first preferred embodiment taken along line VIII-VIII of FIG. 3;

DETAILED DESCRIPTION OF THE PREFERRED EMBODIMENTS

Figure 1:
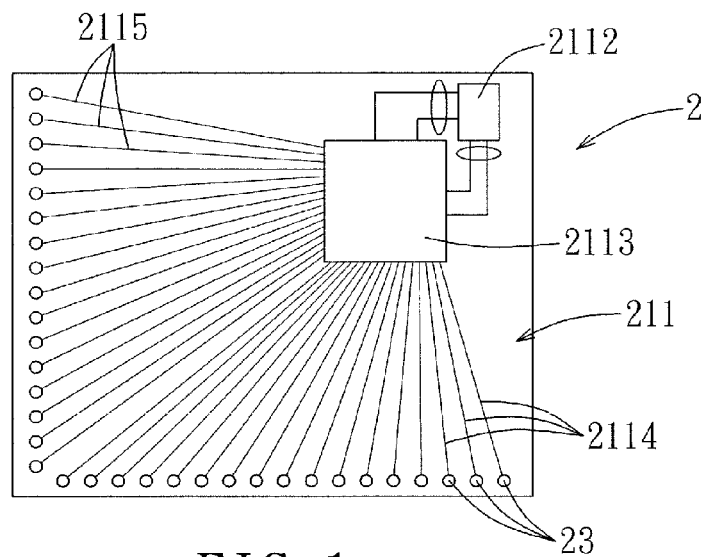
FIG. 1 is a perspective view of a conventional display tile.
Figure 2:
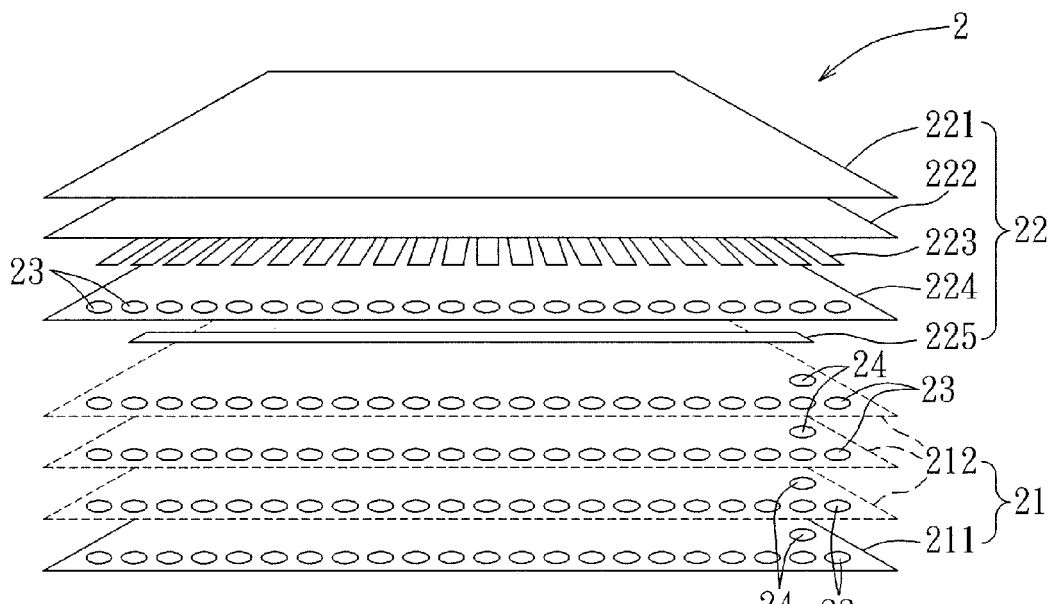
FIG. 2 is an exploded perspective view of the conventional display tile.
Figure 3:
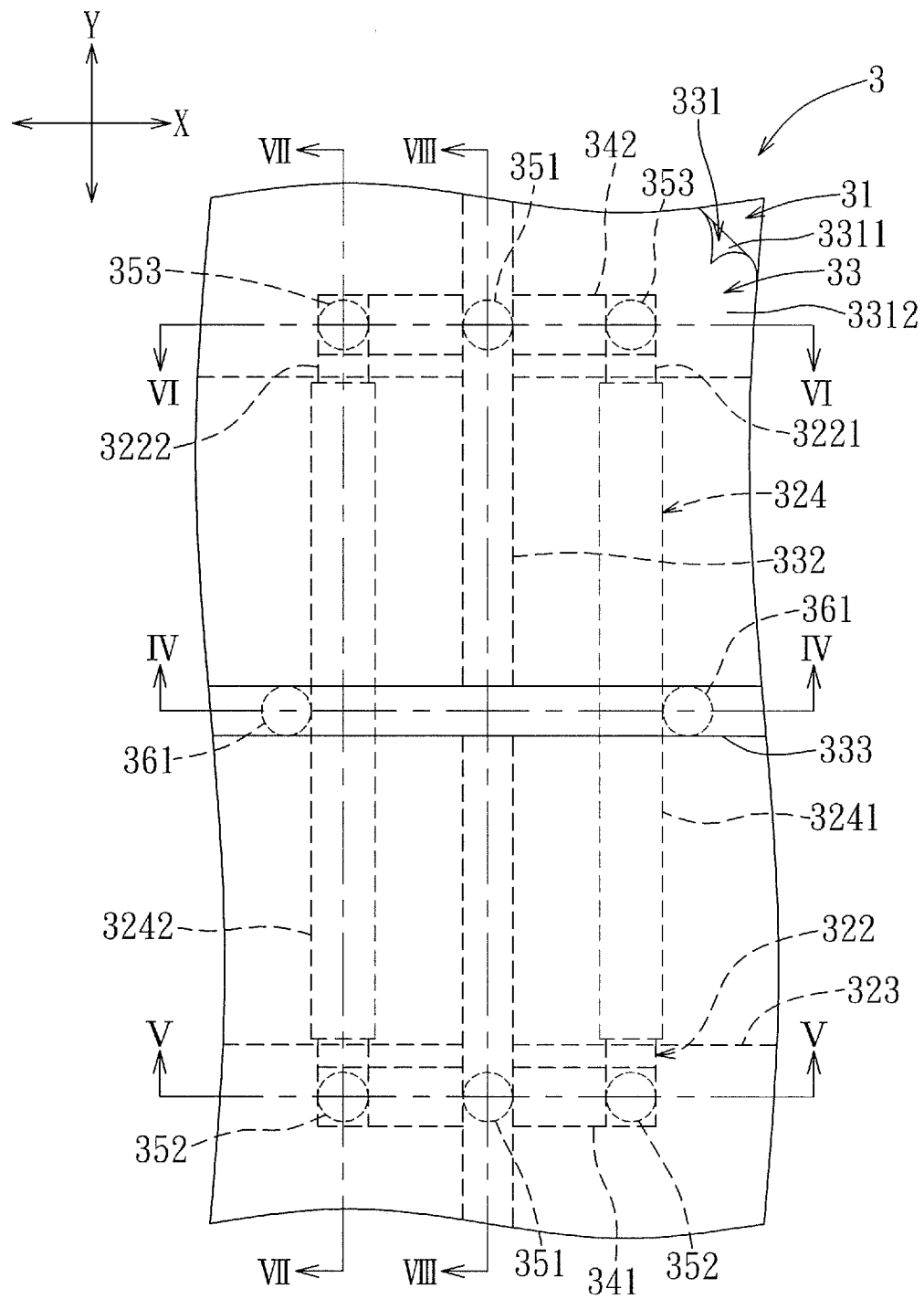
FIG. 3 is a schematic view of the first preferred embodiment of a display pixel according to the present invention.
Figure 4:
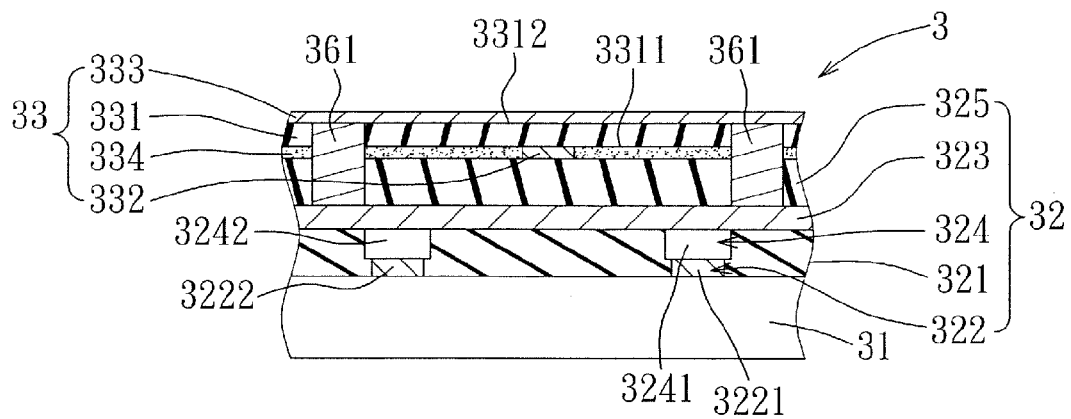
FIG. 4 is a sectional view of the first preferred embodiment taken along line IV-IV of FIG. 3.
Figure 5:
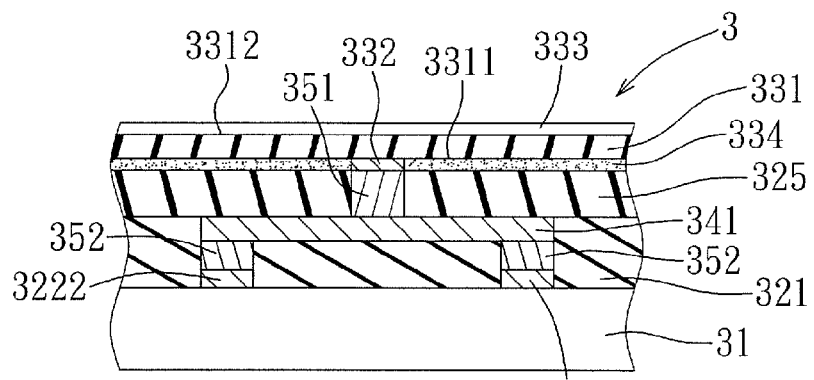
FIG. 5 is a sectional view of the first preferred embodiment taken along line V-V of FIG. 3.
Figure 6:
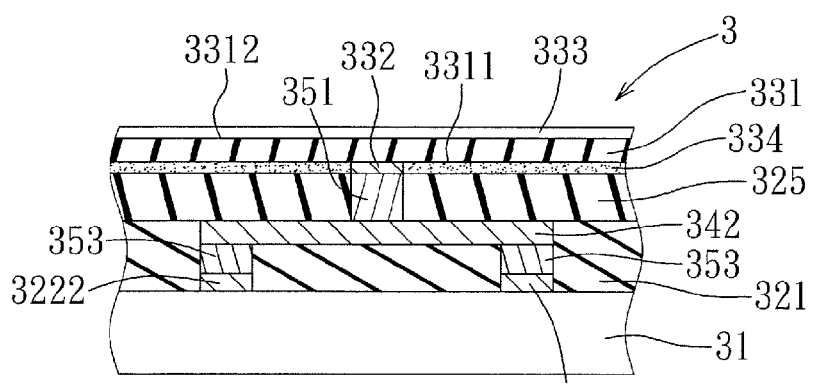
FIG. 6 is a sectional view of the first preferred embodiment taken along line VI-VI of FIG. 3.

Before the present invention is described in greater detail with reference to the accompanying preferred embodiments, it should be noted herein that like elements are denoted by the same reference numerals throughout the disclosure.

Figure 9:
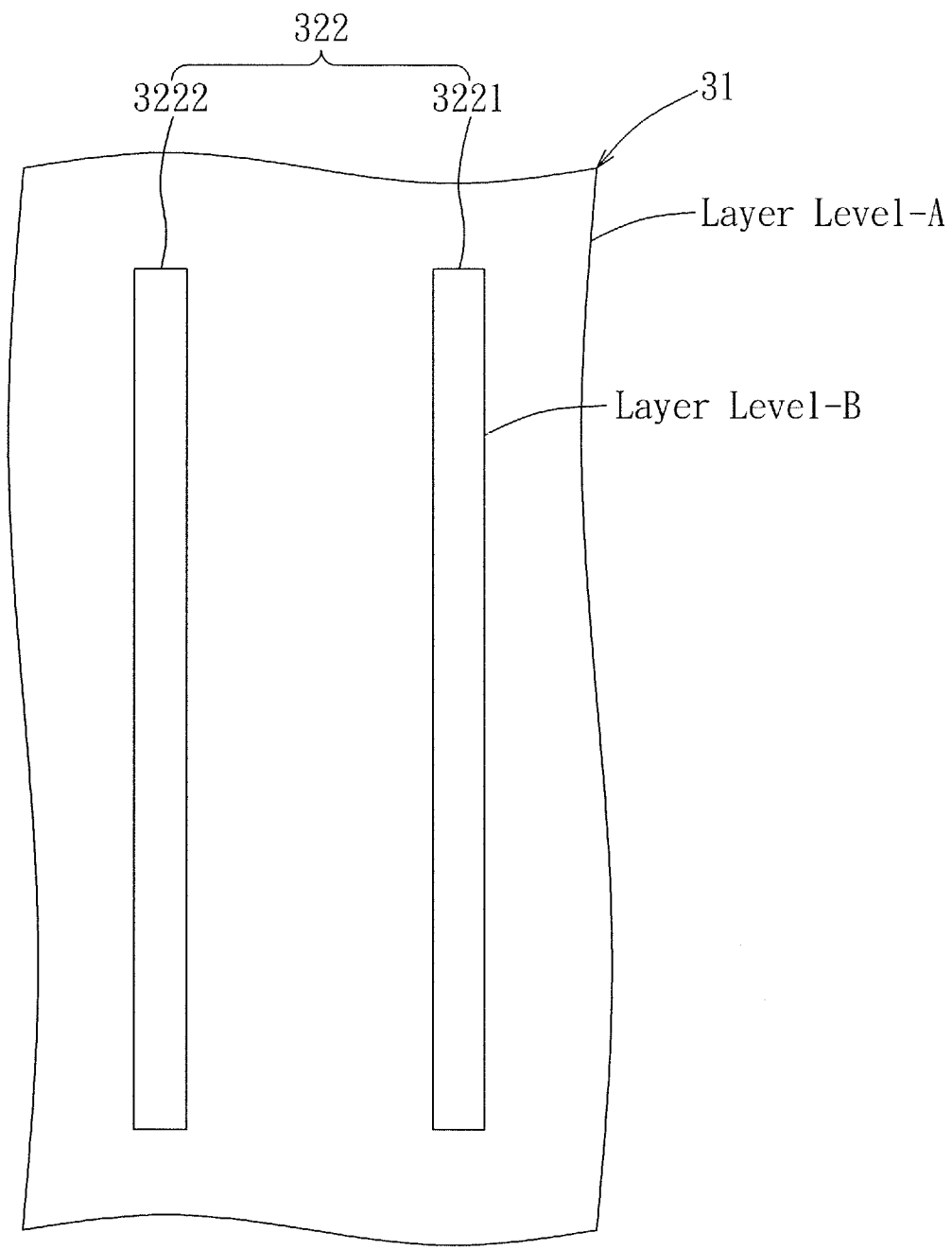
FIG. 9 is a schematic view illustrating a ground level and a first level of the first preferred embodiment.
Figure 10:
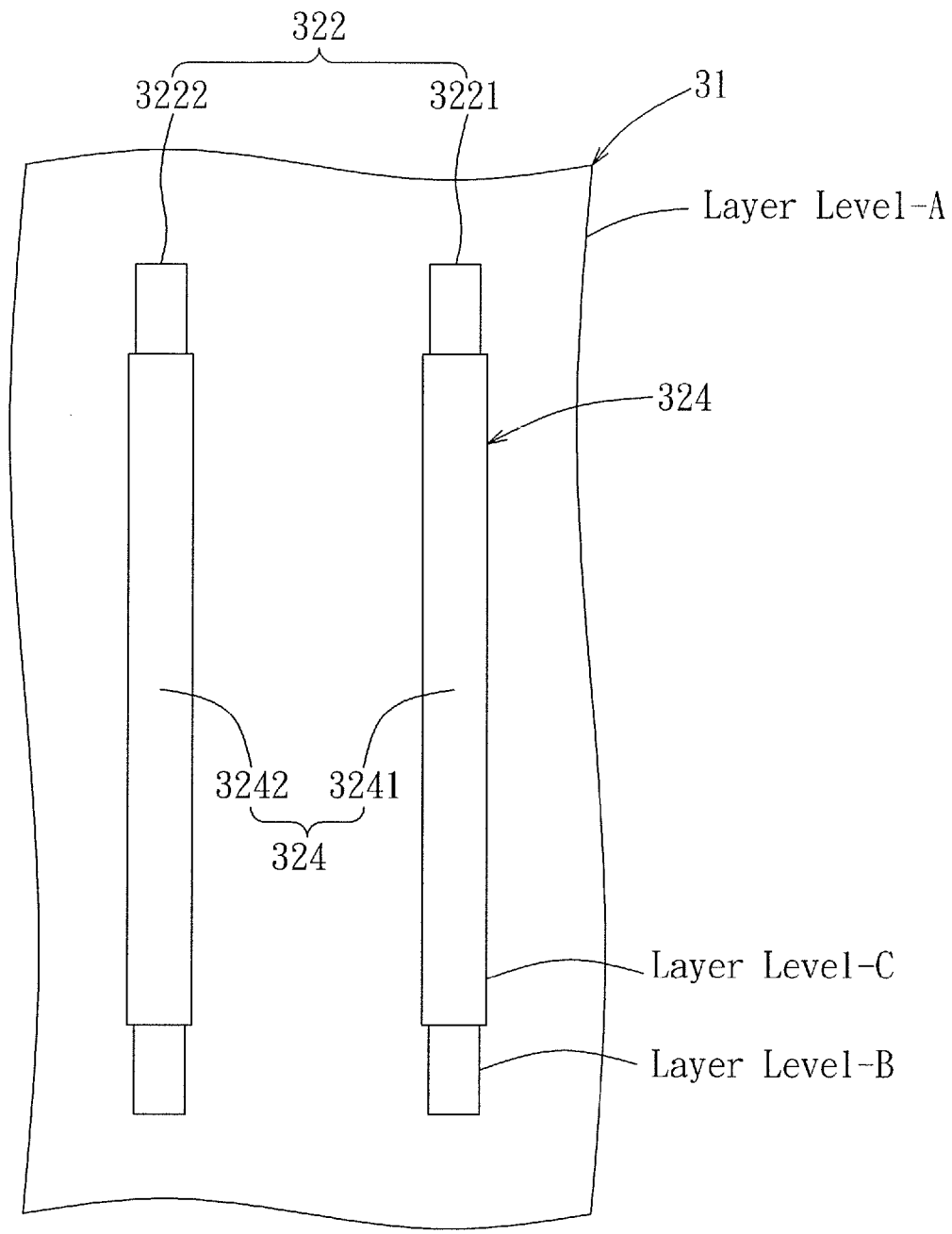
FIG. 10 is a schematic view illustrating a second level of the first preferred embodiment.
Figure 11:
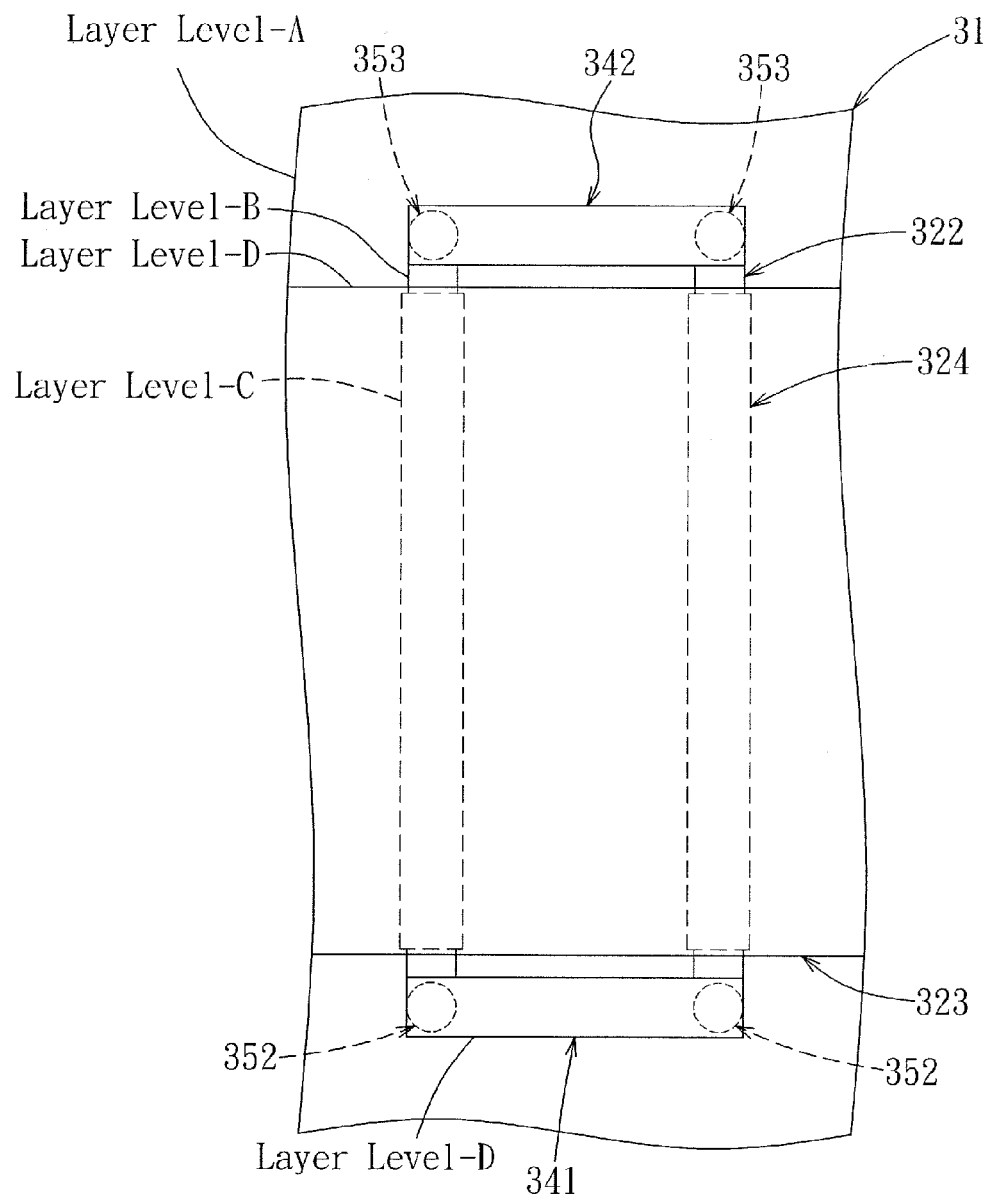
FIG. 11 is a schematic view illustrating a third level of the first preferred embodiment.

FIGS. 3 to 8, in combination with FIGS. 9 to 11, illustrate the first preferred embodiment of a display pixel 3 of a display device (such as an OLED display or an electrophoretic display) according to this invention. The display pixel 3 includes: a transparent substrate 31 (disposed at a ground level indicated as layer level-A in FIG. 9); a first stack 32 including an inter insulative layer 321 formed on the substrate 31, a transparent anode layer 322 (disposed at a first layer level indicated as layer level-B in FIG. 9) formed on the substrate 31 and surrounded by the inter insulative layer 321, a cathode layer 323 surrounded by the inter insulative layer 321, at least one functional layer 324 (disposed at a second layer level indicated as layer level-C in FIG. 10) disposed between the anode layer 322 and the cathode layer 323 (disposed at a third layer level indicated as layer level-D in FIG. 11), and an insulative protection layer 325 formed on the inter insulative layer 321 and the cathode layer 323, the anode layer 322 having juxtaposed first and second anode elements 3221, 3222, the functional layer 324 having first and second functional elements 3241, 3242 disposed on the first and second anode elements 3221, 3222, respectively, the first and second anode elements 3221, 3222 being aligned along a row direction (X), the cathode layer 323 extending across the first and second functional elements 3241, 3242 in the row direction (X); a second stack 33 disposed on the first stack 32 and including a first insulating layer 331 having opposite first and second surfaces 3311, 3312, a conductive column line 332 disposed on the first surface 3311 of the first insulating layer 331 and extending in a column direction (Y) transverse to the row direction (X), a conductive row line 333 disposed on the second surface 3312 of the first insulating layer 331 and extending in the row direction (X), and a second insulating layer 334 disposed between and bonded to the first surface 3311 of the first insulating layer 331 and the insulative protection layer 325; a conductive first bridging line 341 disposed in the first stack 32 and connected to the first and second anode elements 3221, 3222; a conductive second bridging line 342 disposed in the first stack 32, connected to the first and second anode elements 3221, 3222, and opposite to the first bridging line 341 in the column direction (Y); an upper via unit including two upper contact vias 351 extending from the conductive column line 332 through the insulative protection layer 325 into the first stack 32 and connected to the first and second bridging lines 341, 342, respectively; and a cathode via unit including two cathode contact vias 361 extending vertically from the conductive row line 333 through the first and second insulative layers 331, 334 and the insulative protection layer 325 into the first stack 32 and to two opposite ends of the cathode layer 323, respectively.

The first and second functional elements 3241, 3242 are defined herein refer to a structure that can be activated by applying a voltage across the anode layer 322 and the cathode layer 323 to perform functions, such as light emission, light transmission, light modulation, signal processing, signal switching, signal amplification, and signal detection. In this embodiment, the first and second functional elements 3241, 3242 contain an organic electroluminescent medium so that the display pixel 3 is an OLED display pixel. The organic electroluminescent medium is normally comprised of an organic hole-transporting film, an organic electron-transporting film, and an organic light emitting film disposed between the organic hole-transporting film and the organic electron-transporting film.

In this embodiment, the first and second bridging lines 341, 342 are the same layer as the cathode layer 323 (i.e., disposed at the third layer level-D). Alternatively, the first and second bridging lines 341, 342 may be the same layer as the anode layer 322 (not shown).

In this embodiment, the upper contact vias 351 extend vertically from the conductive column line 332 to the first and second bridging lines 341, 342, respectively. The display pixel further includes two first lower contact vias 352 extending vertically and respectively from the first and second anode elements 3221, 3222 through the inter insulative layer 321 to the first bridging line 341, and two second lower contact vias 353 extending vertically and respectively from the first and second anode elements 3221, 3222 through the inter insulative layer 321 to the second bridging line 342. Alternatively, when the first and second bridging lines 341, 342 are formed as the same layer as the anode layer 322, the upper contact vias 351 can extend directly from the conductive column line 332 to one of the first and second anode elements 3221, 3222 or to the first and second bridging lines 341, 342, respectively (not shown).

The transparent substrate 31 and the first and second stacks 32, 33 are preferably flexible so that the entire display device can be made flexible.

The inter insulative layer 321 can be one single layer or multiple layers depending upon the patterning processes of making the lower contact vias 352 and 353 and the first and second conductive bridge lines 341 and 342, adopted in this invention.

The anode layer 322 is made from a conductive transparent material, such as indium tin oxide (ITO). The cathode layer 323 and the first and second bridging lines 341, 342 are preferably made from metal, such as aluminum, copper, silver, gold, and alloys thereof.

The insulative protection layer 325 can be one single layer or multiple layers depending upon the bonding processes of laminating the first stack 32 and the second stack 33.

Figure 12:
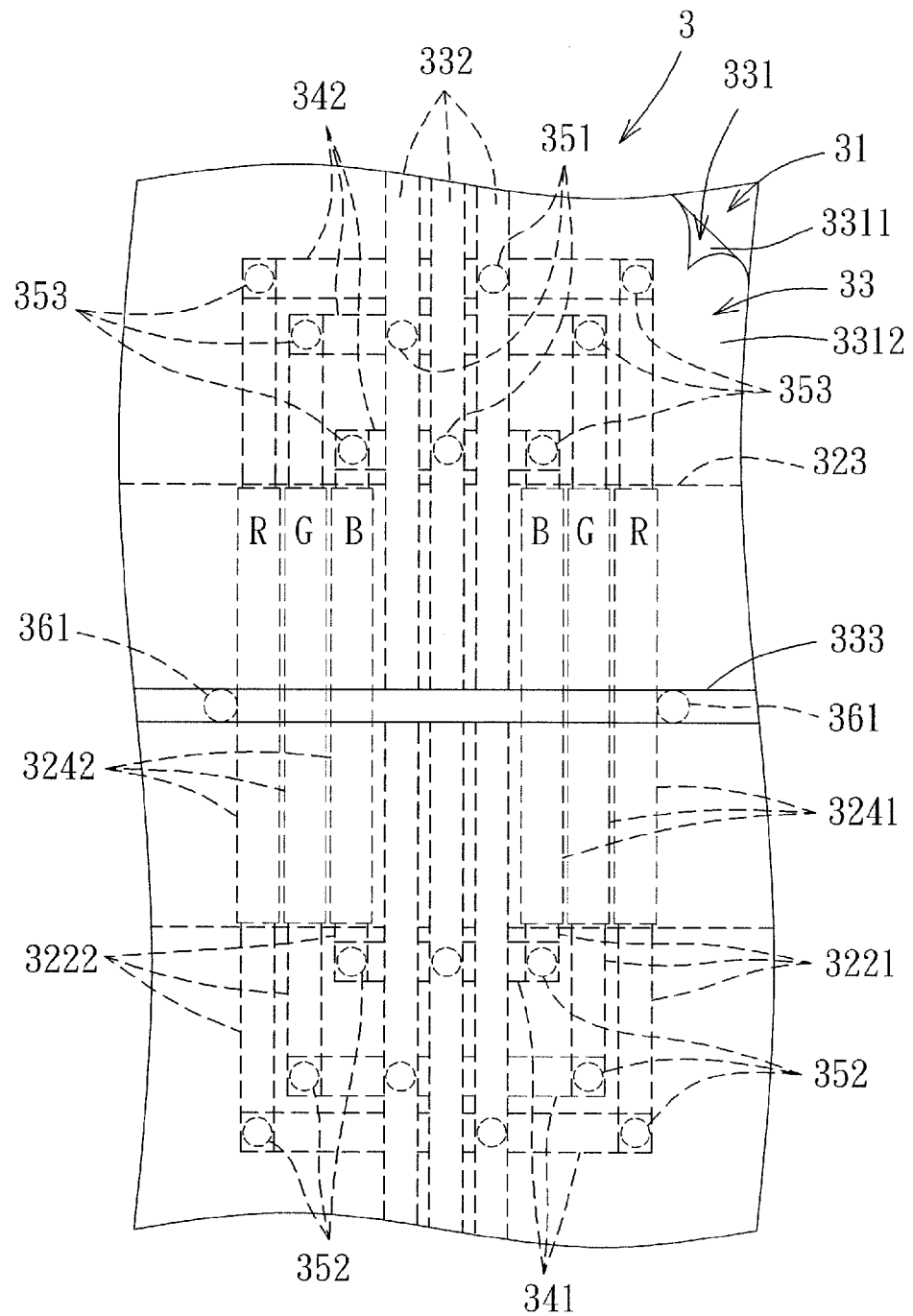
FIG. 12 is a schematic view of the second preferred embodiment of the display pixel according to the present invention.
Figure 13:
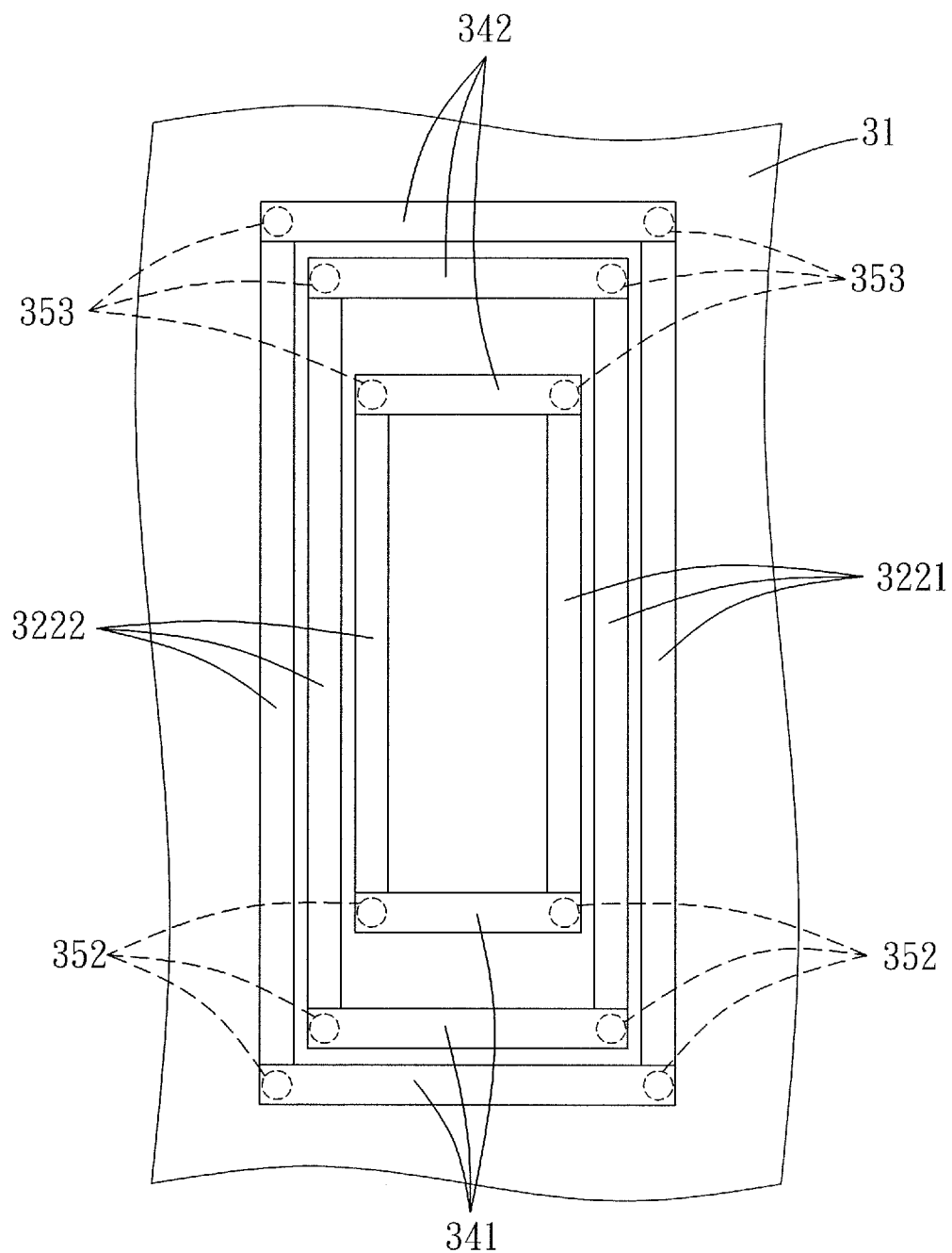
FIG. 13 is a schematic view of an assembly of a substrate, an anode layer, first and second bridging lines and first and second lower contact vias of the second preferred embodiment.

FIGS. 12 and 13 illustrate the second preferred embodiment of a color pixel module 3 of a display device according to this invention. The second preferred embodiment differs from the previous embodiment in that the color pixel module 3 of the second preferred embodiment includes three first anode elements 3221, three second anode elements 3222, three first functional elements 3241 formed respectively on the first anode elements 3221, and three second functional elements 3242 formed respectively on the second anode elements 3222, three column lines 332, three first bridging lines 341, three second bridging lines 342, three upper via units (each including two upper contact vias 351) and three lower via units (each including two first lower contact vias 352 and two second lower contact vias 353). The first and second anode elements 3221, 3222 are aligned along the row direction (X). The first and second bridging lines 341, 342 are aligned along the column direction (Y).

Each of the upper via units and a respective one of the lower via units cooperatively connect a respective one of the conductive column lines 332 to a respective one of the first anode elements 3221 and a respective one of the second anode elements 3222 through a respective one of the first bridging lines 341 and a respective one of the second bridging lines 342. The connection between each upper via units and the corresponding first and second anode elements 3221, 3222 is substantially the same as that of the upper via unit of the first preferred embodiment (see FIGS. 3 to 8).

The first and second functional elements 3241, 3242 are capable of displaying different colors. In this embodiment, the first functional elements 3241 can display red, green and blue colors in a right-to-left direction, and the second functional elements 3242 can display blue, green and red colors in the right-to-left direction. As such, each of the first functional elements 3241 and the corresponding one of the second functional elements 3242, which are respectively formed on the first and second anode elements 3221, 3222 that are connected through the respective one of the first bridging lines 341 and the respective one of the second bridging lines 342 and which are symmetrically disposed, display the same color.

Figure 14:
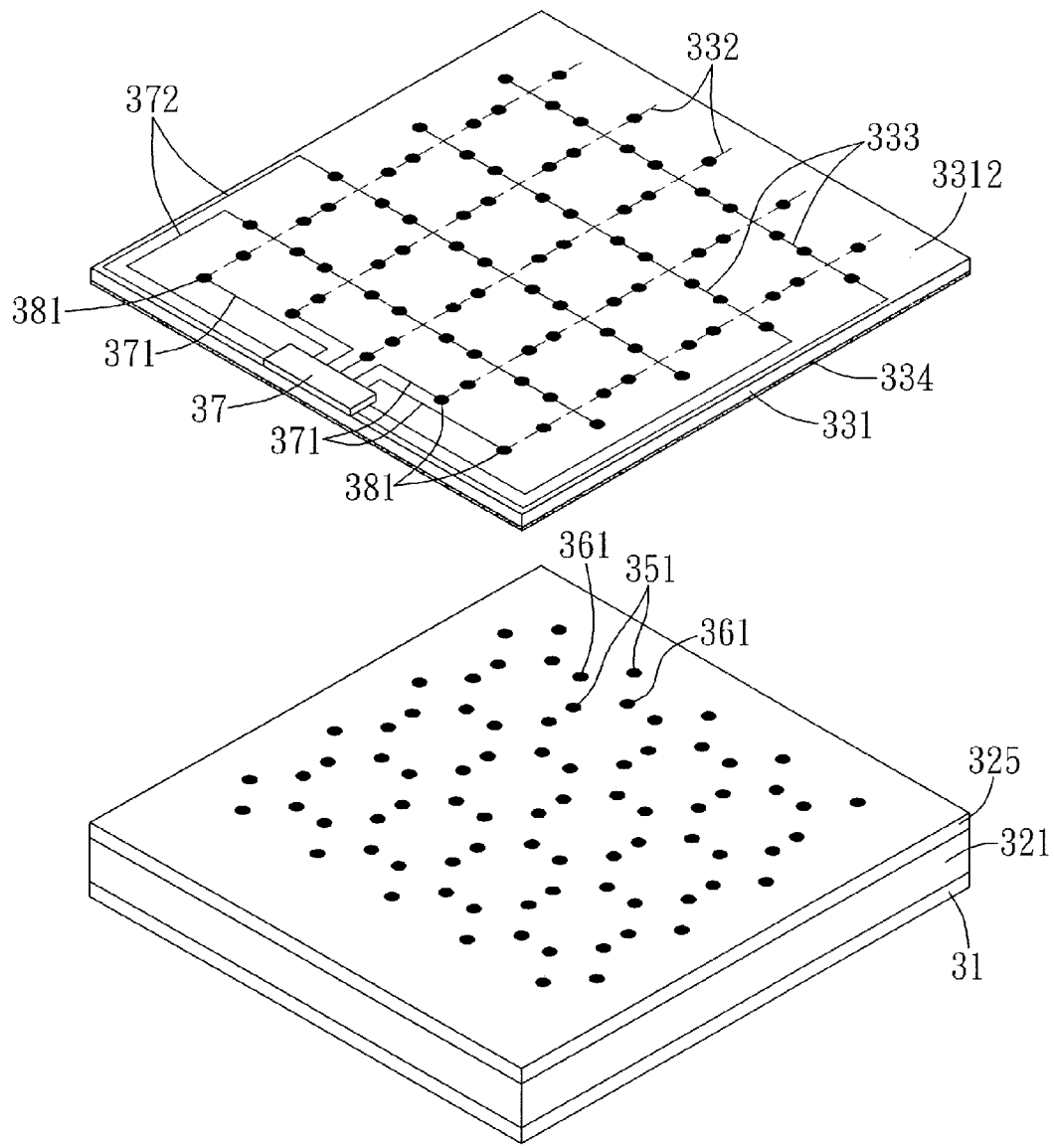
FIG. 14 is an exploded perspective view of the first preferred embodiment of a display device according to the present invention.
Figure 15:
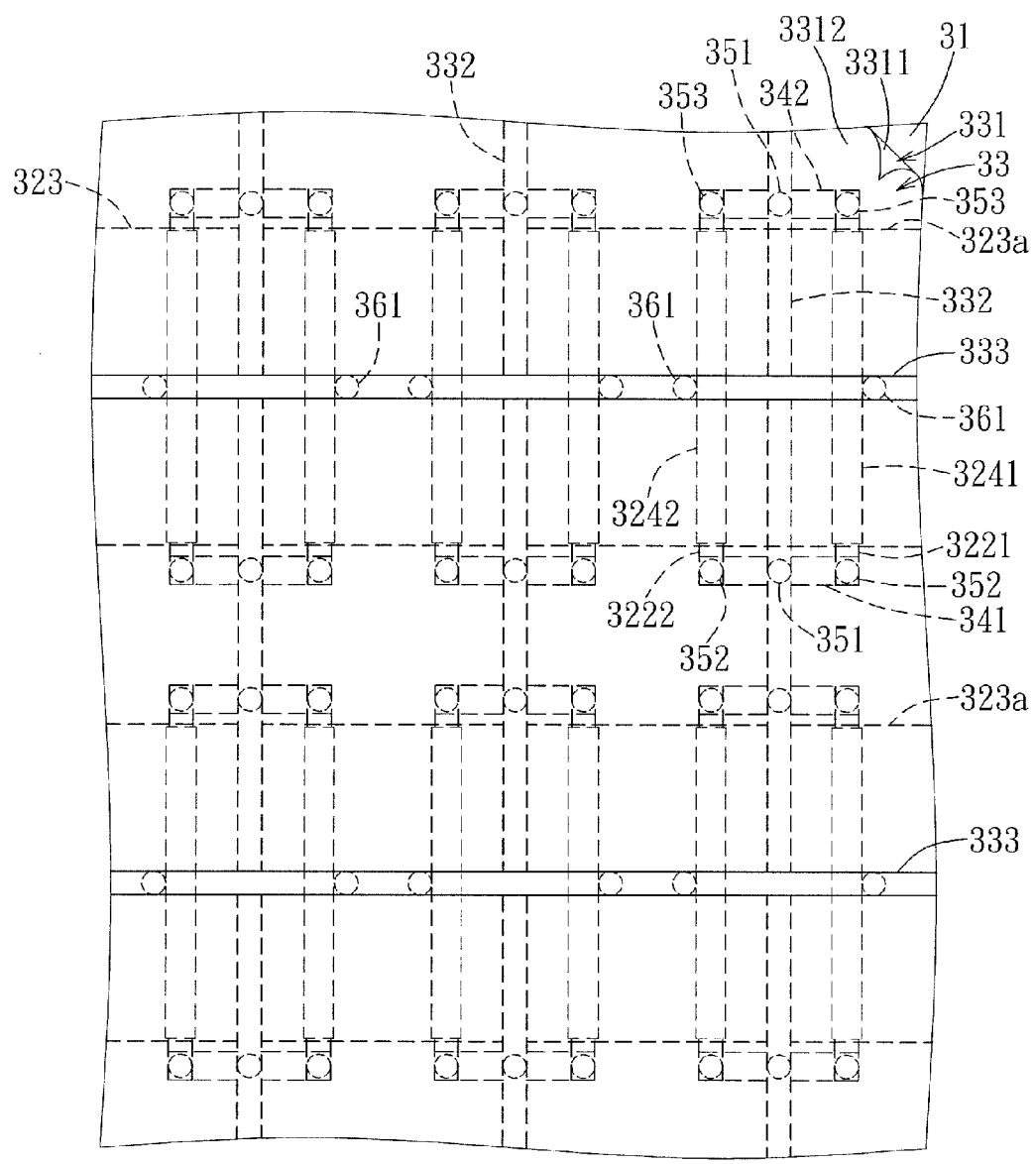
FIG. 15 is a schematic plan view of the first preferred embodiment of the display device.
Figure 16:
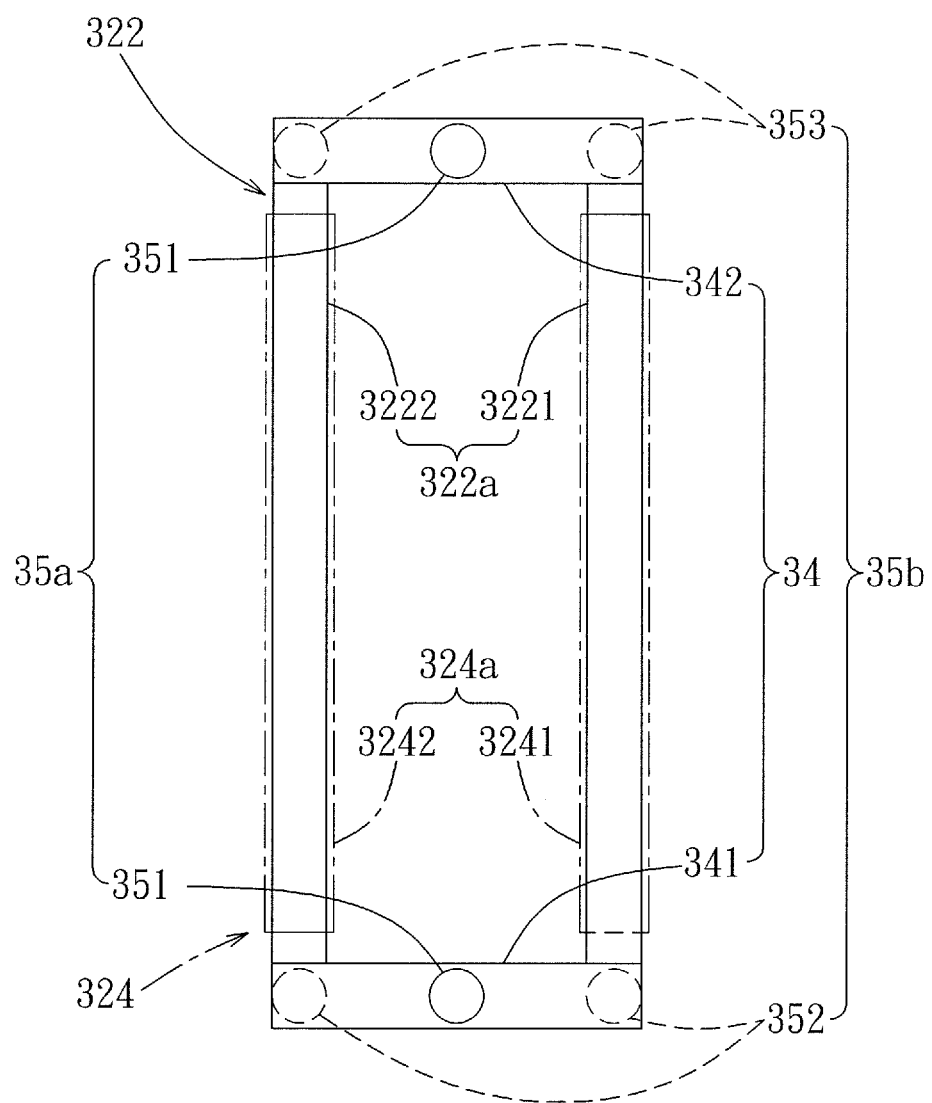
FIG. 16 is a schematic view illustrating an assembly of an anode unit, a functional unit, a bridging unit and a lower via unit of the first preferred embodiment of the display device.

FIGS. 14 to 16, in combination with FIGS. 3 to 8, illustrate the first preferred embodiment of a display device according to this invention. The display device can be viewed as a combination of a plurality of the display pixels 3 of the preferred embodiment shown in FIG. 3, that are arranged in columns and rows. Hence, the first preferred embodiment of the display device includes: a transparent substrate 31; a first stack 32 including a patterned inter insulative layer 321 formed on the substrate 31, a patterned transparent anode layer 322 formed on the substrate 31, a patterned cathode layer 323, a patterned functional layer 324 disposed between the anode layer 322 and the cathode layer 323, and an insulating protection layer 325 formed on the inter insulative layer 321 and the cathode layer 323, the anode layer 322 including an anode array of a plurality of anode units 322a arranged in columns, the cathode layer 323 including a plurality of cathode units 323a, each of which is in the form of a metal band crossing the anode units 322a of a respective one of the rows of the anode array, the functional layer 324 including a display array of a plurality of functional units 324a arranged in columns and formed respectively on the anode units 322a of the anode array; a second stack 33 disposed on the first stack 32 and including a first insulating layer 331 having opposite first and second surfaces 3311, 3312, a plurality of conductive column lines 332 disposed on the first surface 3311 of the insulating layer 331 and extending in a column direction (Y), a plurality of conductive row lines 333 disposed on the second surface 3312 of the insulating layer 331, and a second insulating layer 334 disposed between and bonded to the first insulating layer 331 and the insulative protection layer 325, the conductive row lines 332 extending in a row direction (X) transverse to the column direction (Y); an upper via array of upper via units 35a arranged in columns, the upper via units 35a of each of the columns of the upper via array extending from a respective one of the conductive column lines 332 into the first stack 32 and connected to the anode units 322a of a respective one of the columns of the anode array, respectively; and a cathode via array of cathode contact vias 361 arranged in rows. The cathode contact vias 361 of each of the rows of the cathode via array extend from a respective one of the conductive row lines 333 into the first stack 32 and are connected to a corresponding one of the cathode units 323a.

In this embodiment, each of the anode units 322a of each of the columns of the anode array includes oppositely disposed first and second anode elements 3221, 3222. Each of the functional units 324a of each of the columns of the display array includes oppositely disposed first and second functional elements 3241, 3242 formed on the first and second anode elements 3221, 3222 of the respective one of the anode units 322a of the respective one of the columns of the anode array. The display device further includes a bridge array of bridging units 34 disposed in the first stack, arranged in columns, and disposed as the same layer as the cathode layer 323. Each of the bridging units 34 includes oppositely disposed first and second bridging lines 341, 342. Each of the first and second bridging lines 341, 342 of each of the bridging units 34 of each of the columns of the bridge array is connected to the first and second anode elements 3221, 3222 of a respective one of the anode units 322a of a respective one of the columns of the anode array through a lower via array.

The lower via array includes a plurality of lower via units 35b arranged in columns. Each of the lower via units 35b of each of the columns of the lower via array includes two first lower contact vias 352 extending from the first bridging line 341 of a respective one of the bridging units 34 of a respective one of the columns of the bridging array to the first and second anode elements 3221, 3222 of a respective one of the anode units 322a of a respective one of the columns of the anode array, and two second lower contact vias 353 extending from the second bridging line 342 of a respective one of the bridging units 34 of a respective one of the columns of the bridging array to the first and second anode elements 3221, 3222 of the respective one of the anode units 322a of the respective one of the columns of the anode array.

The display device further includes an IC circuit 37 mounted on an edge of the second surface 3312 of the first insulative layer 331 for controlling the injection of current into the anode units 322a of the anode layer 322. The conductive column lines 332 are electrically connected to the IC circuit 37 through first traces 371 formed on the second surface 3312 of the first insulative layer 331 and vias 381 extending through the first and second surfaces 3311, 3312 of the first insulative layer 331. The conductive row lines 333 are electrically connected to the IC circuit 37 through second traces 372 formed on the second surface 3312 of the first insulative layer 331.

Figure 17:
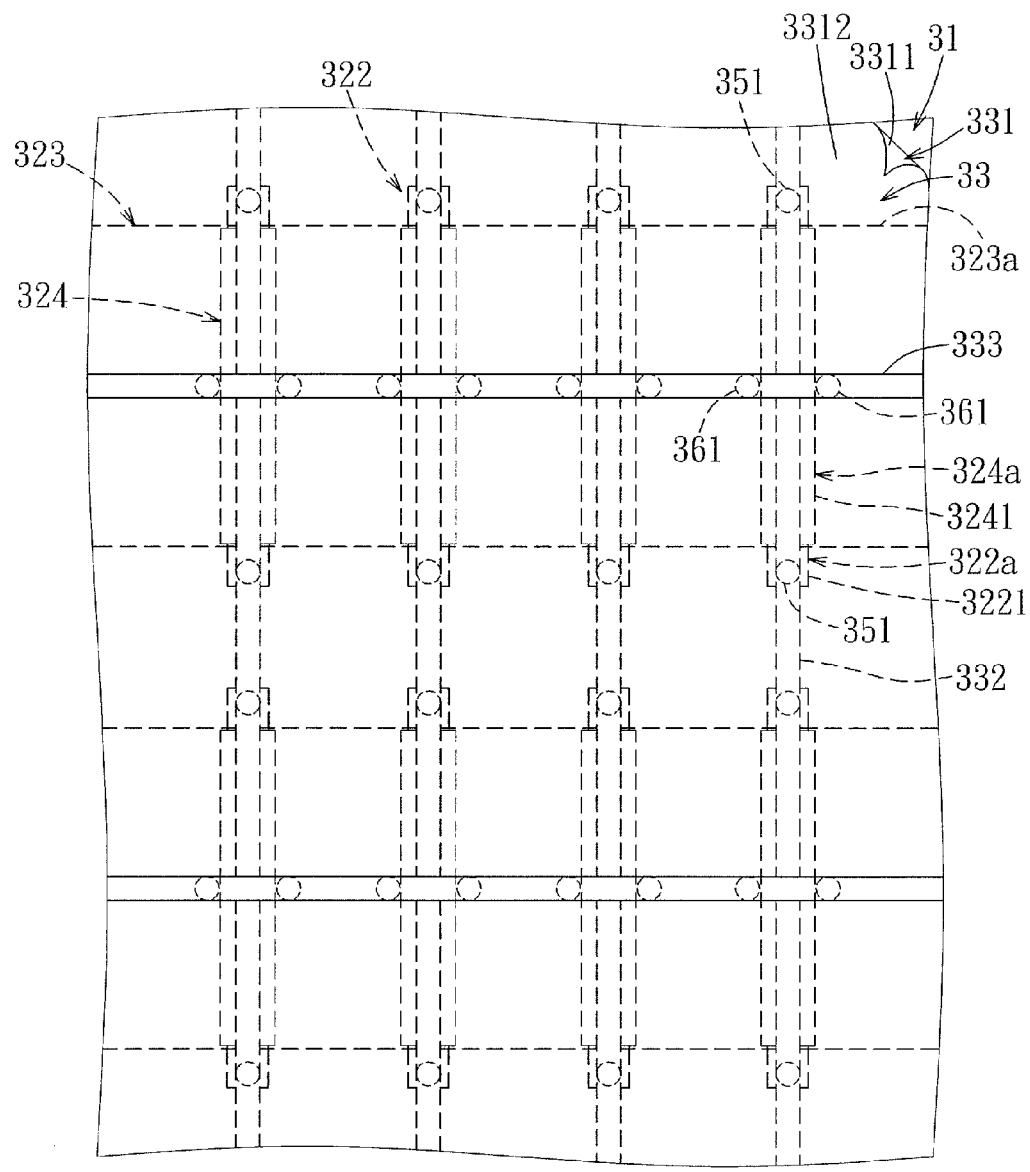
FIG. 17 is a schematic plan view of the second preferred embodiment of the display device according to the present invention.
Figure 18:
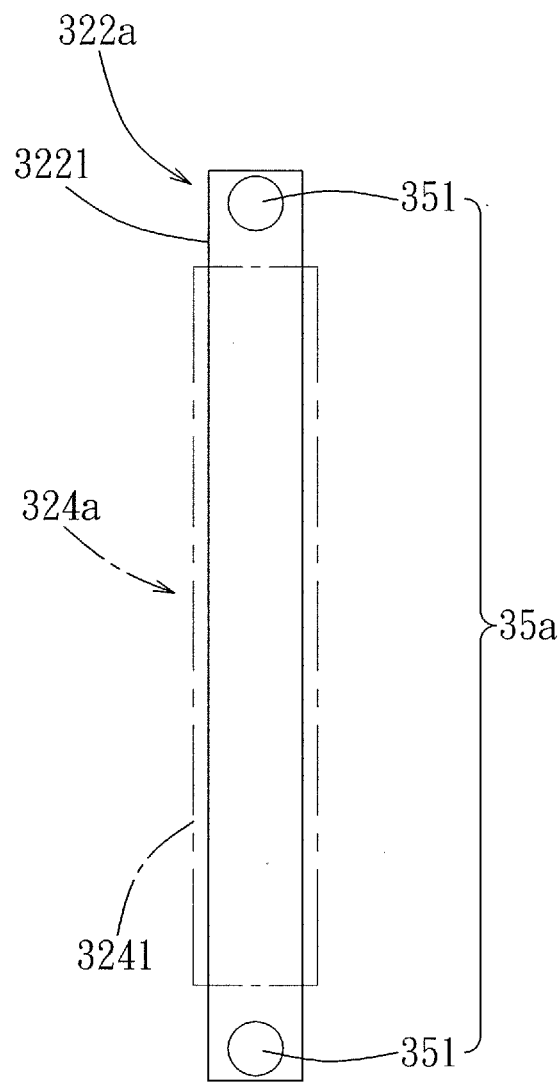
FIG. 18 is a schematic view illustrating an assembly of an anode unit, a functional unit, a bridging unit and a lower via unit of the second preferred embodiment of the display device.

FIGS. 17 and 18 illustrate the second preferred embodiment of the display device according to this invention. The second preferred embodiment of the display device differs from the previous embodiment in that each of the anode units 322a of the anode array includes one anode element 3221, that each of the functional units 324a of the display array includes one functional element 3241 formed on the anode element 3221 of the respective one of the anode units, and that the bridge array is no longer needed. Each of the upper via units 35a of each of the columns of the upper via array includes two upper contact vias 351 extending from the respective one of the conductive column lines 332 to two opposite ends of the anode element 3221 of a respective one of the anode units 322a of a respective one of the columns of the anode array.

The drawbacks of the aforesaid conventional display tile 2, especially for a flexible display tile, include substantially low manufacturing yield and hence poor display quality due to significant layer-to-layer misalignment errors and instable and long current injection path of the transparent material, such as ITO that forms the aforesaid column electrodes 223. Since ITO is easy to break during the patterning and lamination processes, the pixel design of the aforesaid conventional display tile 2 cannot resolve the potential display manufacturing drawbacks resulting from the use of the flexible substrate. Since the aforesaid conventional display tile 2 only has one current injecting point located atone end of each column electrode 223 at which the current from the electronic circuitry 2113 is injected into each column electrode 223, the injected current can only reach a small distance of the entire length of the column electrode 223 due to the high sheet resistance of the transparent conductive material of the column electrode 223. Moreover, as an example, when the column electrode 223 is broken into two halves at a middle position (which is likely to happen during manufacturing process of the display tile 2), the injected current can only flow into one of the halves of the column electrode 223.

With the provision of the first and second bridge lines 341, 342, or the column line 332, and the upper via units in the display pixel 3 of this invention, the number of the current injection paths into the first and second anode elements 3221, 3222 on a flexible substrate can be increased, extremely high precision requirement in layer-to-layer alignment is no longer necessary, and the current can still be injected into the entire length of the first and second anode elements 3221, 3222 when there is a breaking in the first and second anode elements 3221, 3222 during the manufacturing process. Hence, with the inclusion of the first bridging line 341 and/or the second bridging line 342, the column line 332 and the upper via units in the display pixel 3 of this invention, the aforementioned drawback of unsuccessful injection of current to at least some of the functional elements can be overcome.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A display pixel comprising:
   a first stack including a transparent anode layer having separate first and second anode elements that each extend in a column direction and that are aligned with and spaced apart from each other along a row direction transverse to the column direction, a cathode layer, and at least one functional layer disposed between said anode layer and said cathode layer and having first and second functional elements disposed on said first and second anode elements, respectively;
   a second stack disposed on said first stack and including a first insulating layer having a first surface, and a conductive column line disposed on said first surface of said first insulating layer;
   a conductive first bridging line disposed in said first stack and connected to said first and second anode elements, wherein the conductive first bridging line extends in the row direction such that said first and second anode elements are electrically connected to each other through said first bridging line; and
   an upper via unit including an upper contact via extending from said conductive column line into said first stack and connected to said first bridging line or one of said first and second anode elements.

2. The display pixel of claim 1, wherein said first bridging line is disposed as the same layer as one of said anode layer and said cathode layer.

3. The display pixel of claim 2, wherein said first bridging line is disposed as the same layer as said cathode layer, said upper contact via extending from said conductive column line to said first bridging line, said display pixel further comprising two lower contact vias extending respectively from said first and second anode elements to said first bridging line.

4. The display pixel of claim 1, further comprising a second bridging line opposite to said first bridging line in a column direction transverse to the row direction and disposed as the same layer as one of said anode layer and said cathode layer, said second bridging line being connected to said first and second anode elements.

5. The display pixel of claim 4, wherein said upper via unit further includes another upper contact via extending from said conductive column line into said first stack and connected to said second bridging line or one of said first and second anode elements.

6. The display pixel of claim 1, wherein said first insulating layer further has a second surface opposite to said first surface, said second stack further including a conductive row line disposed on said second surface of said first insulating layer and extending in a row direction, said conductive column line extending in a column direction transverse to the row direction, said display pixel further comprising a cathode via unit having at least one cathode contact via extending from said conductive row line to said cathode layer.

7. The display pixel of claim 1, further comprising a transparent substrate, said anode layer being formed on said substrate, said first stack further including an inter insulative layer formed on said substrate, and an insulative protection layer formed on said inter insulative layer and said cathode layer.

8. The display pixel of claim 7, wherein said second stack further includes a second insulating layer disposed between and bonded to said first surface of said first insulating layer and said insulative protection layer.

9. The display pixel of claim 1, wherein said first and second functional elements contain an organic electroluminescent medium.

10. A color pixel module comprising:
    a first stack including a transparent anode layer, a cathode layer, and at least one functional layer disposed between said anode layer and said cathode layer, said anode layer having a plurality of first anode elements and a plurality of second anode elements, each of said first anode elements extend in a column direction and are aligned with and spaced apart from a respective one of said second anode elements along a row direction transverse to the column direction, said functional layer having a plurality of first functional elements formed respectively on said first anode elements and capable of displaying different colors, and a plurality of second functional elements formed respectively on said second anode elements and capable of displaying the same colors as said first functional elements, respectively;
a second stack disposed on said first stack and including a first insulating layer having a first surface, and a plurality of conductive column lines disposed on said first surface of said first insulating layer;
a plurality of conductive first bridging lines, each of which is disposed in said first stack and is connected to a respective one of said first anode elements and a respective one of said second anode elements, wherein one of said conductive first bridging lines extends in the row direction such that one of said first and one of said second anode elements are electrically connected to each other through one of said first bridging lines; and
a plurality of upper via units, each of which includes an upper contact via extending from a respective one of said conductive column lines into said first stack and connected to a corresponding one of said first bridging lines or a corresponding one of said first and second anode elements.

11. The color pixel module of claim 10, wherein each of said first functional elements and the corresponding one of said second functional elements, which are respectively formed on said first and second anode elements that are connected through the respective one of said first bridging lines, display the same color.

12. The color pixel module of claim 11, comprising a plurality of second bridging lines opposite to said first bridging lines in a column direction transverse to the row direction, each of said second bridging lines being connected to a respective one of said first anode elements and a respective one of said second anode elements.

13. The color pixel module of claim 12, wherein each of said upper via units further includes another upper contact via extending from a respective one of said conductive column lines into said first stack and connected to a corresponding one of said second bridging lines or a corresponding one of said first and second anode elements.

14. A display device comprising:
a first stack including a patterned transparent anode layer, a patterned cathode layer, and a patterned functional layer disposed between said anode layer and said cathode layer, said anode layer including an anode array of spaced apart anode units arranged in columns and rows, said cathode layer including a plurality of cathode units, said functional layer including a display array of functional units arranged in columns and formed on said anode units of said anode array, respectively;
a second stack disposed on said first stack and including an insulating layer having opposite first and second surfaces, a plurality of conductive column lines disposed on said first surface of said insulating layer, and a plurality of conductive row lines disposed on said second surface of said insulating layer;
an upper via array of upper via units arranged in columns, said upper via units of each of said columns of said upper via array extending from a respective one of said conductive column lines into said first stack and connected to said anode units of a respective one of said columns of said anode array, respectively; and
a cathode via array of cathode contact vias arranged in rows, said cathode contact vias of each of said rows of said cathode via array extending from a respective one of said conductive row lines into said first stack and connected to a corresponding one of said cathode units,
wherein each of said anode units of each of said columns of said anode array includes oppositely disposed first and second anode elements that each extend in a column direction and that are aligned with and spaced apart from each other along a row direction transverse to the column direction, said display device further comprising a bridge array of bridging units disposed in said first stack and arranged in columns, each of said bridging units of each of said columns of said bridge array being connected to said first and second anode elements of a respective one of said anode units of a respective one of said columns of said anode array,
wherein each of the bridging units extend in the row direction such that the said first and second anode elements are electrically connected to each other through said first bridging line.

15. The display device of claim 14, wherein each of said cathode units is in the form of a metal band crossing said anode units of a respective one of said rows of said anode array.

16. The display device of claim 14, wherein each of said upper via units of each of said columns of said upper via array extending from the respective one of said conductive column lines to a respective one of said anode elements of a respective one of said columns of said anode array.

17. The display device of claim 16, wherein each of said upper via units of each of said columns of said upper via array includes two upper contact vias extending from the respective one of said conductive column lines to two opposite ends of the respective one of said anode elements of the respective one of said columns of said anode array.

* * * * *